US012804868B2

(12) United States Patent
Pachha et al.

(10) Patent No.: US 12,804,868 B2
(45) Date of Patent: Nov. 17, 2026

(54) EMI SHIELDING FOR COMPOSITE BATTERY ENCLOSURE

(71) Applicant: Magna Exteriors Inc., Aurora (CA)

(72) Inventors: Ranjit Pachha, Brampton (CA); Axel Lachenmaier, Rudersberg (DE); Siddhartha Asthana, Ann Arbor, MI (US); Brian A. Krull, Sterling Heights, MI (US)

(73) Assignee: Magna Exteriors Inc., Aurora (CA)

( * ) Notice: Subject to any disclaimer, the term of this patent is extended or adjusted under 35 U.S.C. 154(b) by 357 days.

(21) Appl. No.: 18/553,916

(22) PCT Filed: Apr. 5, 2022

(86) PCT No.: PCT/US2022/023495
§ 371 (c)(1),
(2) Date: Oct. 4, 2023

(87) PCT Pub. No.: WO2022/216718
PCT Pub. Date: Oct. 13, 2022

(65) Prior Publication Data

US 2024/0357781 A1 Oct. 24, 2024

Related U.S. Application Data

(60) Provisional application No. 63/170,856, filed on Apr. 5, 2021.

(51) Int. Cl.
*B60K 1/02* (2006.01)
*H01M 50/224* (2021.01)
(Continued)

(52) U.S. Cl.
CPC ........ *H05K 9/0047* (2013.01); *H01M 50/224* (2021.01); *H01M 50/227* (2021.01);
(Continued)

(58) Field of Classification Search
CPC .... B60K 1/04; H01M 50/224; H01M 50/227; H01M 50/233; H01M 50/249; H01M 50/231; H01M 2220/20; H04K 9/0081
See application file for complete search history.

(56) References Cited

U.S. PATENT DOCUMENTS 7,597,833 B1 * 10/2009 Brause ................ B29C 45/0053 29/603.03
10,283,824 B2 * 5/2019 Moschet ................ F28F 1/025
(Continued)

FOREIGN PATENT DOCUMENTS

EP 2647486 A1 10/2013
KR 20180134059 A 12/2018
(Continued)

OTHER PUBLICATIONS

International Search Report for PCT/US2022/023495 mailed Jul. 26, 2022, 2-pages.

*Primary Examiner* — Marc Q Jimenez
*Assistant Examiner* — James J Triggs

(57) ABSTRACT

A method for electro-magnetic interference shielding (EMI) of a battery box (10) or other EMI emitting device in a vehicle. The method includes the steps of forming a battery box enclosure (10) with an effective amount of a shielding material (20) attached to the enclosure (10). In one embodiment the box (10) is an SMC or injection molded preformed enclosure (10), and a metallic material (20) is attached to the enclosure (10) on an interior or exterior side of the enclosure (10). In another embodiment the enclosure (10) and mesh (20) are formed in the same mold cavity (24) for embedding the shielding material (20) in the enclosure (10).

23 Claims, 4 Drawing Sheets

(51) Int. Cl.

| | |
|---|---|
| ***H01M 50/227*** | (2021.01) |
| ***H01M 50/231*** | (2021.01) |
| ***H01M 50/233*** | (2021.01) |
| ***H01M 50/249*** | (2021.01) |
| ***H05K 9/00*** | (2006.01) |
| *C09J 133/14* | (2006.01) |
| *C09J 163/00* | (2006.01) |

(52) U.S. Cl.
CPC ....... *H01M 50/231* (2021.01); *H01M 50/233* (2021.01); *H01M 50/249* (2021.01); *H05K 9/0045* (2013.01); *H05K 9/0081* (2013.01); *C09J 133/14* (2013.01); *C09J 163/00* (2013.01); *H01M 2220/20* (2013.01)

(56) References Cited

U.S. PATENT DOCUMENTS

| | | | | |
|---|---|---|---|---|
| 2006/0117862 | A1* | 6/2006 | Shank | E05F 15/46<br>73/780 |
| 2007/0011863 | A1* | 1/2007 | Yoshikawa | H10F 19/80<br>29/592.1 |
| 2012/0100414 | A1* | 4/2012 | Sonta | H01M 50/278<br>429/163 |
| 2013/0248241 | A1 | 9/2013 | Harney | |
| 2021/0305544 | A1* | 9/2021 | Miloaga | H01M 50/293 |
| 2022/0006150 | A1* | 1/2022 | Foran | H01M 50/227 |

FOREIGN PATENT DOCUMENTS

| | | | |
|---|---|---|---|
| WO | 2017067783 | A1 | 4/2017 |
| WO | 2020008061 | A1 | 1/2020 |

* cited by examiner

EMI SHIELDING FOR COMPOSITE BATTERY ENCLOSURE

CROSS-REFERENCE TO RELATED APPLICATIONS

This application is a National Stage of PCT International Patent Application No. PCT/US2022/023495, filed Apr. 5, 2022 and claims the benefit of U.S. Provisional Patent Application No. 63/170,856, filed Apr. 5, 2021. The disclosures of the above applications are incorporated herein by reference.

FIELD OF THE INVENTION

The present invention relates to providing EMI shielding for composite battery enclosure.

BACKGROUND OF THE INVENTION

With the onset of battery powered vehicles becoming increasingly important, higher current and amperage banks of batteries are being used to provide longer range in an electric vehicle. Additionally, cables between battery and engine carry high current that produces magnetic field which causes interference in electronic instruments.

These batteries are required to be housed in a box or some sort of container within the vehicle. Typically, a light aluminum material is used because it does not burn easily should there be a malfunction in one of the battery cells. However, aluminum does get brittle after a raised temperature event and does have a fairly low melting point. Aluminum boxes cannot withstand temperatures over 680 degrees centigrade plus these materials are conductive and as such are not the best selection for batteries storing electricity potential. Thus, using a material such as an SMC material as a substitute is desirable.

Typically, SMC materials can be made fire retardant by using fire retardant filler materials incorporated within the SMC compound. Typically, EMI shielding on non-composite plastics are provided typically by EMI spray coating. These filler materials may also assist somewhat in stopping stray electro-magnetic metal plated non-woven tape has been used in the past to provide EMI shielding. However, improved compositions with improved methods of manufacture for providing electromagnetic shielding are desirable.

SUMMARY OF THE INVENTION

In the present invention there is provided a method for electro-magnetic interference shielding (EMI) of a battery box or other EMI emitting device in a vehicle. The method includes the steps of forming a battery box enclosure with an effective amount of a shielding material attached to the enclosure. In one embodiment the box is an SMC preformed enclosure, and a metallic EMI shielding material is attached to the enclosure on an interior or exterior side of the enclosure. In another embodiment the enclosure and EMI shielding material are formed in the same mold cavity for embedding the shielding material within the SMC used to make the enclosure. In another embodiment of the invention a preformed aluminum foil insert with adhesive is used for integrally molding an aluminum film covered SMC composite battery box.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
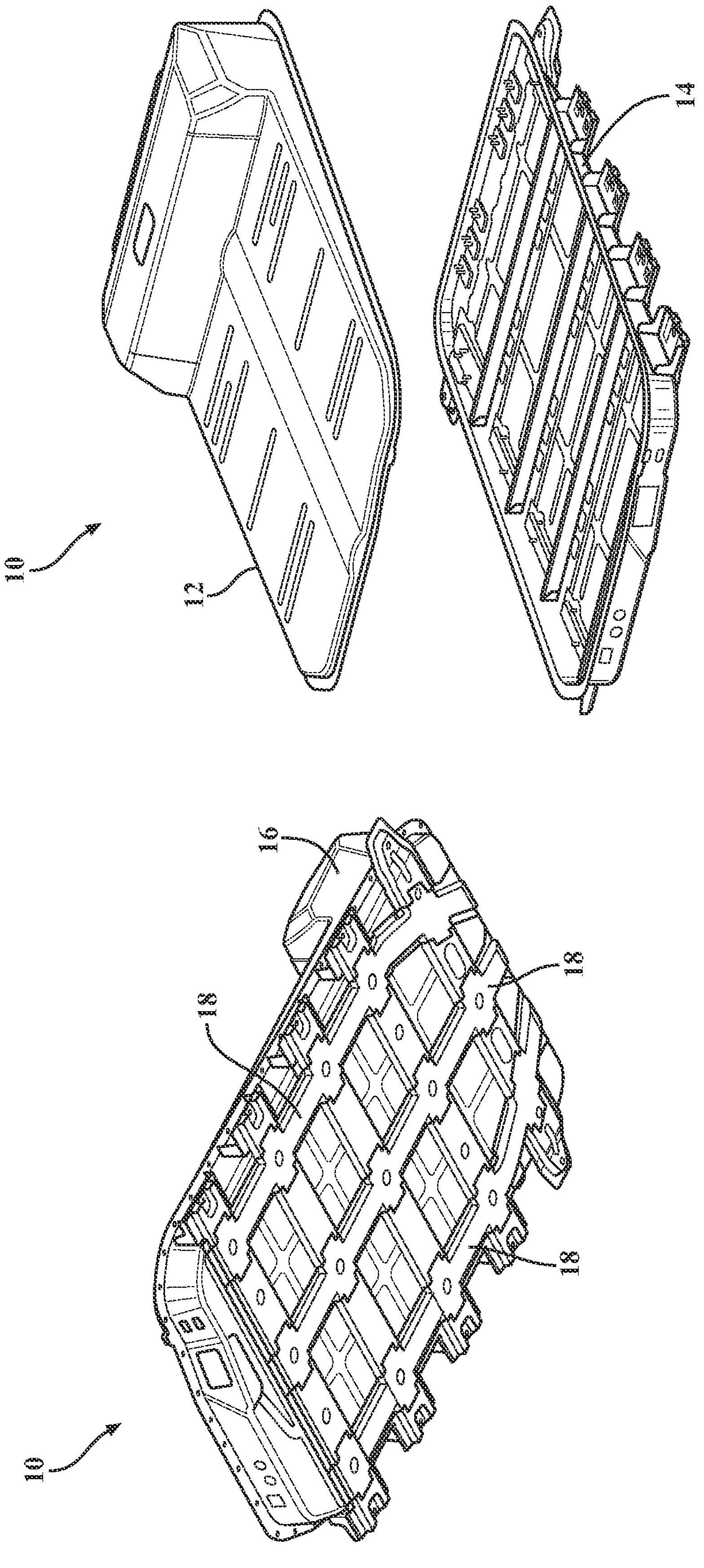
FIG. 1 is a perspective view showing a typical battery box or other enclosure requiring EMI shielding.
Figure 2:
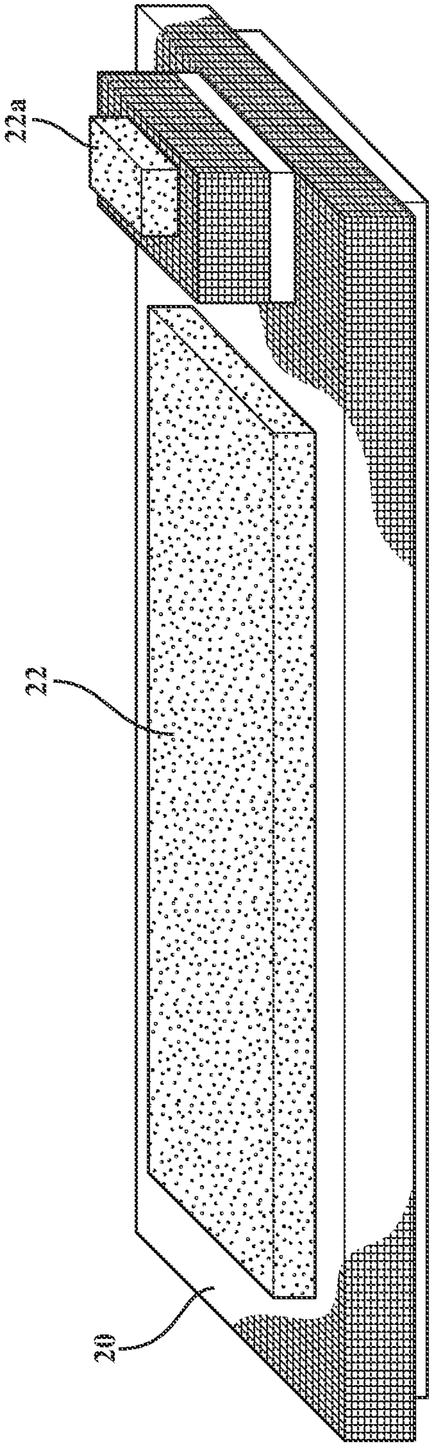
FIG. 2 is a schematic view showing a typical formation of a "green" SMC shielding construction in the present invention.

The following description of the preferred embodiment(s) is merely exemplary in nature and is in no way intended to limit the invention, its application, or uses.

In accordance with the present invention there is provided a method for electro-magnetic interference shielding (EMI) shielding of a battery box or other EMI emitting device in a vehicle generally shown at 10. The battery box or enclosure 10 includes an upper portion 12 and a lower portion 14. The batteries are placed inside the enclosure, and it is secured by way of suitable fasteners to form a unit 16. Wire channels 18 may also be provided for allowing battery cable connections and connections to the vehicle power systems.

The battery boxes of the present invention are composite and made flame retardant by way of various fillers. In the present invention compression molded flame retardant filled SMC materials 22, 22*a* are molded into a final relatively light weight flame retardant final box with the addition of an EMI shielding layer of material either throughout or in areas where it is needed most.

The method includes the steps of forming a battery box enclosure 10 with an effective amount of a shielding material 20 attached to the enclosure. In one embodiment the box is an SMC preformed enclosure or an injection molded thermoplastic enclosure and a metallic EMI shielding material is attached to the enclosure on an interior or exterior side of the enclosure. In another embodiment shown in FIG. 3 the enclosure and shielding material are formed in the same mold cavity for embedding the shielding material in the enclosure.

In accordance with a first method a battery box or other enclosure is first formed and thereafter an EMI shielding material is attached to the enclosure by way of an adhesive or the like such that the parts become integral. Preferably, the enclosure is an SMC or injection molded thermoplastic preformed enclosure, and a metallic EMI shielding material is attached to the enclosure on an interior or exterior side of the enclosure. The metallic EMI shielding material is preformed to the surface shape and dimensions of the enclosure and secured to the enclosure or it can be placed on a molding platen designed to accommodate the form of the battery material and the EMI shielding material is press form molded to the shape of the battery box enclosure. In this method the entire shape of the enclosure can be EMI shielded or only the areas where shielding is desired or necessary. Thus, in this embodiment the part is formed in a first mold and then the part is placed on a bonding fixture and thereafter the shielding material is molded with adhesive into the form of the part in the bonding fixture.

The EMI shielding material is selected from the group comprising metallized non-woven fabric, woven fabric, metal foil, metal mesh, expanded metal foil and mesh, coated metal foil and/or mesh, wherein the shielding material has a thickness of from about 0.01 to about 0.9 mm and preferably 0.02 to about 0.4 mm. Preferably, the EMI shielding material is a woven or non-woven fabric coated with aluminum, copper, nickel, brass, silver or a combination of these.

Typically, adhesives used are selected from the group consisting of hot melt adhesive; one component liquid adhesive; two component acrylic polyurethane adhesive, epoxy adhesive and combinations thereof. Typically, the adhesive covers from about 10 to about 100% of the part surface where the shielding material is to be applied. Preferably, the adhesive covers from about 50-100% of the part surface where the shielding material is to be applied. The adhesive can be applied with a suitable method such as spraying, brushing, continuous/discontinuous bead, dollops, or the like. In a preferred embodiment the adhesive is integrated with the EMI shielding material and is carried on a removable carrier film. In this way the EMI shielding material can be applied at its location and the carrier sheet removed prior to further attachment steps.

Figure 3:
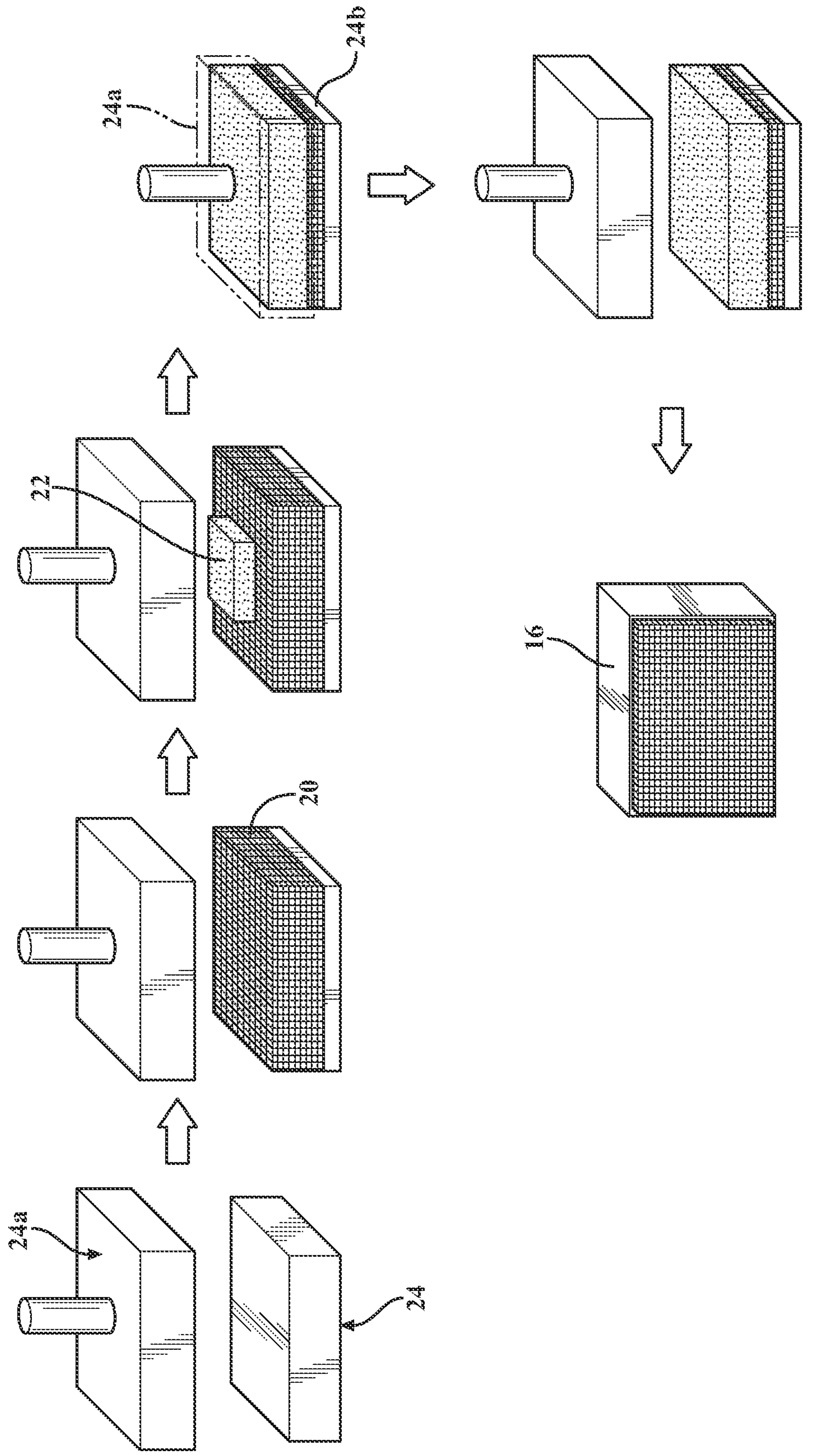
FIG. 3 is a schematic view of the forming process of the shielded battery box of the present invention.

Referring to FIG. 3 there is provided a method for in situ forming of a shielded battery box enclosure wherein the enclosure and EMI shielding material are formed in the same mold cavity for embedding the shielding material within the SMC material, used to make the enclosure.

In this method a battery box enclosure with an effective amount of a shielding material molded are formed in the same mold cavity for embedding the shielding material in the enclosure.

The EMI shielding material is first placed in a heated sheet molding tool 24, 24*a* and an effective amount of sheet molding compound 22 is placed in the mold 24, 24*a* adjacent the mold material, thereafter the mold is closed for forming an SMC part with an embedded EMI material 16 therein. After opening the mold, the resultant finished part with an embedded EMI material is produced.

The EMI material may be placed on top or on bottom of the SMC material or is sandwiched between SMC layers prior to molding of a final part.

The SMC material is selected from the group consisting of polyester, vinyl ester, phenolic, and epoxy SMC materials and mixtures thereof which contain glass fiber, carbon fiber or basalt fillers and strengtheners.

Again, the EMI shielding material is a woven or non-woven fabric coated with copper, nickel, silver or a combination of these. Preferably, the EMI shielding material is a woven or non-woven fabric comprising nickel coated graphite fabric. In another embodiment of the present invention, the EMI shielding material is metallic foil, mesh or expanded mesh made of aluminum, copper, brass, nickel or silver.

In this method, the EMI shielding material has a thickness of from about 0.01 to about 0.9 mm and preferably from about 0.02 to about 0.4 mm.

Figure 4:
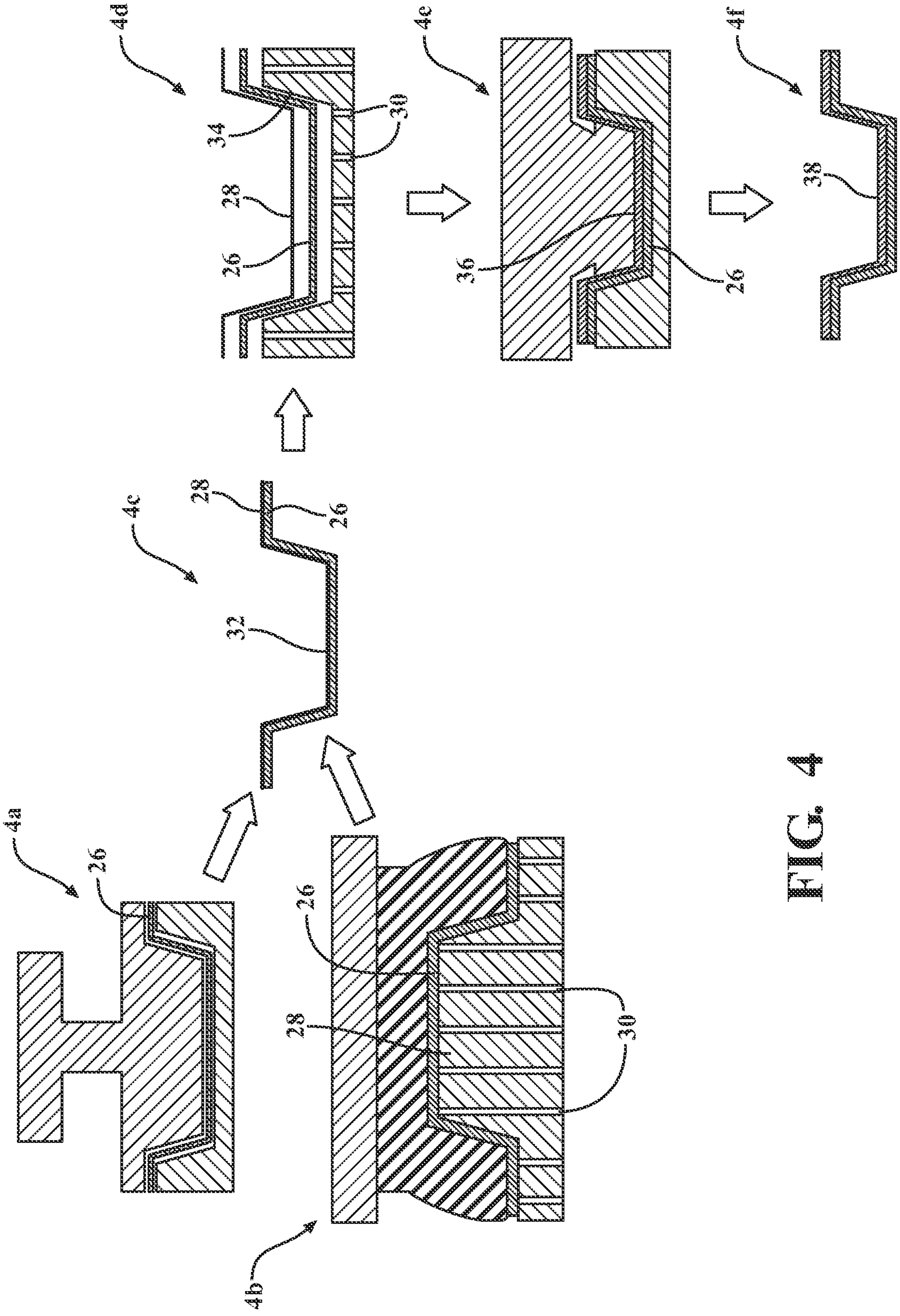
FIG. 4 is a process diagram of a further embodiment of the process of the present invention.

In another embodiment shown in FIG. 4 an aluminum foil sheet 26 with a release sheet is preformed to match the inner or outer shape of the battery box or other part as is shown in FIG. 4*a* or 4*b*. A silicone membrane as shown in 4*b* can be used to form the part by drawing a vacuum 30 in the mold. Alternatively, a preform of the sheet is accomplished under compression as shown in 4*a*. As shown in 4*c* a preform of the aluminum foil with a release layer Such as a Kraft® or 3M® release liner attached is formed. An example of a type of material useful in the present invention is an ALF200L material available from Intertape polymer group Sarasota, Florida. The formed aluminum foil and release liner is then removed from the mold for repositioning for attachment of the battery box or other cover. In the next step 4*d* the aluminum foil with the release film is drawn into the mold by a vacuum and the release film is removed as shown in the dashed lines 28 in FIG. 4*d*. This allows easy release of the preformed aluminum and pressure sensitive adhesive with release film combination shown at 32.

Thereafter, as shown in step 4*e* the aluminum preform 26 is either compression bonded with a cover or underlying part 38. Preferably, the cover or underlying part 38 is an SMC material, however, any other suitable material could be used such as thermoformed or injection molded filled or unfilled polyolefins, ABS, styrene or other material. The parts typically produced are battery boxes so a second preferred material is a long glass or carbon fiber filled material. SMC material in a suitable mold (with or without heat) or alternatively the final part is drawn into the final mold cavity 34 with a vacuum 30. In step 4*e* a bonding press is used to attach the SMC material 36 to the aluminum preform 26. As shown in FIG. 4*f* the result is a battery housing or the like with a form following aluminum sheet integrally boned to the SMC material to form a battery cover or other shielded panel or container. Preferably the aluminum foil thickness useful in the present invention is from about 0.02 mm to about 0.35 mm. The thickness of the release film and aluminum foil is from about 0.05 to about 0.44 mm. In a preferred embodiment pressure sensitive adhesives such as an acrylic adhesive is utilized. However, other adhesives may be utilized in accordance with the teachings of the present invention.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for shielding of a vehicle component or other electromagnetic interference emitting device in a vehicle comprising the steps of:

forming a battery box enclosure with an electromagnetic shielding material attached to the enclosure, wherein the enclosure includes an upper portion and a lower portion that is connected to the upper portion to define a space between the lower portion and the upper portion in which batteries are received, wherein the lower portion and the upper portion are both formed of a sheet molding compound and the shielding material is a metallized woven fabric, wherein the shielding material is preformed to correspond to a surface shape and dimensions of the enclosure, and the shielding material is secured to the enclosure during formation of the enclosure.

2. The method of claim 1 wherein the shielding material is embedded in the enclosure.

3. The method in accordance with claim 1 wherein the enclosure is a sheet molding compound preformed enclosure, and the shielding material is attached to the enclosure on an interior or exterior of the enclosure.

4. The method in accordance with claim 3 wherein an adhesive is used to attach the shielding material to the enclosure.

5. The method in accordance with claim 1 wherein the enclosure and shielding material are formed in a mold cavity for embedding the shielding material in the enclosure.

6. The method in accordance with claim 1 wherein the shielding material is coated with aluminum, copper, nickel, brass, silver or a combination of these.

7. The method in accordance with claim 1 wherein adhesive is used to attach the shielding material to the enclosure.

8. The method in accordance with claim 7 wherein the adhesive includes hot melt adhesive, one component liquid adhesive, two component acrylic, polyurethane, epoxy, silicone adhesives and combinations thereof.

9. The method in accordance with claim 7 wherein the adhesive covers from 10 to 100% of the portion of the enclosure where the shielding material is to be applied.

10. The method in accordance with claim 7 wherein the adhesive covers from 50 to 100% of the portion of the enclosure where the shielding material is to be applied.

11. The method in accordance with claim 1 wherein the enclosure is formed in a first mold and then the enclosure is placed on a bonding fixture and thereafter the shielding material is molded with adhesive into the form of the enclosure in the bonding fixture.

12. The method in accordance with claim 7 wherein the shielding material and adhesive are applied using a removeable carrier liner.

13. The method in accordance with claim 1 wherein the shielding material has a thickness of from 0.01 to 0.9 mm.

14. A method for shielding of a vehicle battery, comprising the steps of:

forming a battery enclosure adapted to house a vehicle battery, wherein the enclosure has a shielding material attached to the enclosure, wherein the shielding material is an aluminum foil with a pressure sensitive adhesive and a release layer, and the shielding material is preformed, by compression forming or by drawing the shielding material into a mold under a vacuum, to match an inner shape or an outer shape of the enclosure, and wherein the release layer is removed after the shielding material is formed in the mold, and the shielding material is pressure bonded to the enclosure.

15. The method of claim 14 wherein the aluminum foil is drawn in a vacuum for forming the aluminum foil with the pressure sensitive adhesive and the release layer.

16. The method of claim 14 wherein either a vacuum or a mold is used to join the aluminum foil and the enclosure together.

17. A method for shielding of a battery box enclosure for a vehicle comprising the steps of:

forming a battery box enclosure of a sheet molding compound material;

connecting an electromagnetic interference shielding material to an interior side or an exterior side of the enclosure using an adhesive, wherein the shielding material is formed into the shape of the interior side or the exterior side before the shielding material is connected to the enclosure, and wherein the shielding material is first placed in a heated sheet molding tool and an effective amount of sheet molding compound is placed in the mold adjacent the mold material, thereafter the mold is closed for compression forming sheet molding compound part with the shielding material embedded thereon.

18. The method of 17 wherein the sheet molding compound includes polyester, vinyl ester, phenolic, and epoxy sheet molding compound materials and mixtures thereof which contain glass fiber, carbon fiber or basalt fillers and strengtheners.

19. The method of claim 17 wherein the shielding material is a woven or non-woven fabric coated with copper, nickel, silver or a combination of these.

20. The method of claim 17 wherein the shielding material is a woven or non-woven fabric comprising nickel coated graphite fabric.

21. The method of claim 17 wherein the shielding material has a thickness of from about 0.01 to about 0.6 mm.

22. The method of claim 17 wherein the enclosure is a composite battery enclosure.

23. The method of claim 1 wherein the shielding material is a nickel coated graphite fabric.

* * * * *